United States Patent
Ball

(10) Patent No.: US 7,576,572 B2
(45) Date of Patent: Aug. 18, 2009

(54) RAIL-TO-RAIL COMPARATOR WITH HYSTERESIS

(75) Inventor: Matthew David Ball, Newcastle-Under-Lyme (GB)

(73) Assignee: Jennic Limited (GB)

( * ) Notice: Subject to any disclaimer, the term of this patent is extended or adjusted under 35 U.S.C. 154(b) by 12 days.

(21) Appl. No.: 11/899,397

(22) Filed: Sep. 5, 2007

(65) Prior Publication Data

US 2009/0058471 A1   Mar. 5, 2009

(51) Int. Cl.
*H03K 5/22* (2006.01)
(52) U.S. Cl. .............................. 327/65; 327/63; 327/66; 327/67; 327/68; 327/69; 327/70
(58) Field of Classification Search ............. 327/63–65, 327/67–70
See application file for complete search history.

(56) References Cited

U.S. PATENT DOCUMENTS 6,384,637 B1 * 5/2002 Nguyen et al. ................ 327/54

* cited by examiner

*Primary Examiner*—Lincoln Donovan
*Assistant Examiner*—Daniel Rojas
(74) *Attorney, Agent, or Firm*—Wilmer Cutler Pickering Hale & Dorr LLP.

(57) ABSTRACT

A comparator, comprising at least one current stage for providing a first current proportional to a difference between first and second comparator inputs, the first current being provided to an amplifier input; an amplifier for amplifying a current provided to the amplifier input and providing a comparator output; apparatus for introducing hysteresis, comprising at least one of a current source and a current sink, the current source being arranged to selectively source a source current to the amplifier input such that the comparator output changes from a first state to a second state when a difference between the first and second inputs rises above a first value, and the current sink being arranged to selectively sink a sink current from the amplifier input such that the comparator output changes from the second state to the first state when the difference between the first and second inputs falls below a second value; and apparatus for controlling at least one of the source current and the sink current to be proportional to a bias current of the current stage.

6 Claims, 5 Drawing Sheets

600

RAIL-TO-RAIL COMPARATOR WITH HYSTERESIS

FIELD OF THE INVENTION

Embodiments of this invention relate to a comparator, such as a comparator with hysteresis.

BACKGROUND OF THE INVENTION

A comparator is an electronic component or device that compares two inputs (such as input voltages and/or currents). The output of the comparator indicates which input has the larger value. For example, where the inputs are two input voltages, the output indicates which input voltage is the higher voltage. The output of the comparator is typically a digital voltage, in that it takes one of two levels, such as logic 0 and logic 1.

FIG. 1 shows an example of a comparator 100. The comparator 100 includes positive and negative voltage inputs 102 and 104, to which input voltages $v_1$ and $v_2$ are provided. The comparator output 106 carries a voltage $v_{out}$ that indicates which of the voltages $v_1$ and $v_2$ is higher. Typically, the output voltage $v_{out}$ is logic 1 when $v_1$ is greater than $v_2$, and logic when $v_2$ is greater than $v_1$.

If the inputs are very close to each other in value then the output can switch between levels very quickly. Furthermore, a change in the output of the comparator may cause a change in conditions in which the comparator is used, causing the output to quickly change back again.

Hysteresis may be introduced into the comparator to reduce the possibility of the comparator output switching levels quickly. FIG. 2 shows an example of the output $v_{out}$ 200 of a comparator with hysteresis. A comparator with no hysteresis may switch output levels when a difference $v_{diff}$ between the inputs is a (a may be zero volts). A comparator with hysteresis switches from logic 0 to logic 1 when $v_{diff}$ rises to b, and from logic 1 to logic 0 when $v_{diff}$ falls c, where b>c. Thus, if $V_{diff}$ reaches b, then the output of the comparator changes from logic 0 to logic 1, whereas $v_{diff}$ must fall to c before the comparator changes from logic 1 to logic 0.

An example of a comparator 300 that includes hysteresis is shown in FIG. 3. The comparator 300 includes a current stage 302 to which input voltages $v_1$ and $v_2$ are provided. The current stage 302 has an output current $i_c$ that is proportional to the difference $v_{diff}$ between the input voltages, $v_{diff}=v_1-v_2$. the output current $i_c$ is provided to the input of an amplifer 304 that amplifies the current input and provides an output voltage $v_{out}$ that indicates whether the input current is positive or negative.

The comparator 300 includes a first current source 310 and a first switch 312 connected in series between a positive power supply voltage $V_{dd}$ and the input to the amplifier 304. The comparator 300 also includes a second current source 314 and a second switch 316 connected in series between the input to the amplifier 304 and ground (or alternatively a negative power supply voltage $V_{ss}$).

The switches 312 and 316 are controlled such that when the output $v_{out}$ of the amplifier 304 is logic 1, the switch 312 is closed and the switch 316 is open. Thus, a current $I_1$ is sourced to the input of the amplifier 304, and is added to the current $i_c$ from the current stage 302. As a result, the current $i_c$ must drop further to switch the output of the amplifier from 1 to 0 compared to if the current $I_1$ is not present. Similarly, when the output $v_{out}$ of the amplifier 304 is logic 0, the switch 312 is open and the switch 316 is closed. Thus, a current 12 is sunk from the input of the amplifier 304, and is subtracted from the current $i_c$ from the current stage 302. As a result, the current $i_c$ must rise further to switch the output of the amplifier from 0 to 1 compared to if the current $I_2$ is not present. Thus, the comparator 300 has hysteresis such as that shown in FIG. 2.

The current stage 302 includes transistors that have a bias current. Changes in operating conditions of the comparator 300, such as changes in temperature and/or power supply voltages, may cause the bias current to change, causing the transconductance of the current stage 302 to change. Thus, the positions of b and c in FIG. 2 may change.

It is an object of embodiments of the invention to at least mitigate one or more of the problems of the prior art.

SUMMARY OF THE INVENTION

According to a first aspect of embodiments of the invention, there is provided a comparator, comprising at least one current stage for providing a first current proportional to a difference between first and second comparator inputs, the first current being provided to an amplifier input; an amplifier for amplifying a current provided to the amplifier input and providing a comparator output; apparatus for introducing hysteresis, comprising at least one of a current source and a current sink, the current source being arranged to selectively source a source current to the amplifier input such that the comparator output changes from a first state to a second state when a difference between the first and second inputs rises above a first value, and the current sink being arranged to selectively sink a sink current from the amplifier input such that the comparator output changes from the second state to the first state when the difference between the first and second inputs falls below a second value; and apparatus for controlling at least one of the source current and the sink current to be proportional to a bias current of the current stage.

Thus, the hysteresis voltage of the comparator does not substantially change even with changes in transconductance and/or bias current of the current stage.

In certain embodiments, the current source comprises at least one first input transistor for producing a first input current in response to the first input, and at least one second transistor for producing a second input current in response to the second input, the bias current of the current stage substantially comprising a sum of the first and second input currents. These currents can be mirrored and processed to produce, for example, signals controlling the current source and/or sink. Preferably, the comparator comprises control apparatus for receiving at least one of the first and second input currents and producing control signals proportional to the at least one of the first and second input currents, the control signals being used to control the at least one of the current source and the current sink. The current source and/or sink may comprise, for example, transistors, and the control signals may be provided to the gates of the transistors.

In certain embodiments, the apparatus for controlling comprises apparatus for generating at least one control signal for the at least one of the source current and the sink current such that the at least one control signal is proportional to the bias current of the current stage.

According to a second aspect of embodiments of the invention, there is provided a method of comparing two signals, comprising producing a first current proportional to a difference between the two signals; providing the first current to an amplifier input; amplifying the current provided to the amplifier input to produce a comparator output; sourcing a source current to the amplifier input when the comparator output is a first logic level; sinking a sink current from the amplifier input when the comparator output is a second logic level; and controlling at least one of the source current and the sink current to be proportional to a bias current of apparatus used to produce the first current.

BRIEF DESCRIPTION OF THE DRAWINGS

Embodiments of the invention will now be described by way of example only, with reference to the accompanying drawings, in which.

DETAILED DESCRIPTION OF EMBODIMENTS OF THE INVENTION

Embodiments of the invention use the bias current of the current stage to control one or more hysteresis current sources to ensure that the hysteresis current supplied by the hysteresis current sources is proportional to the bias current of the current stage.

Figure 4:
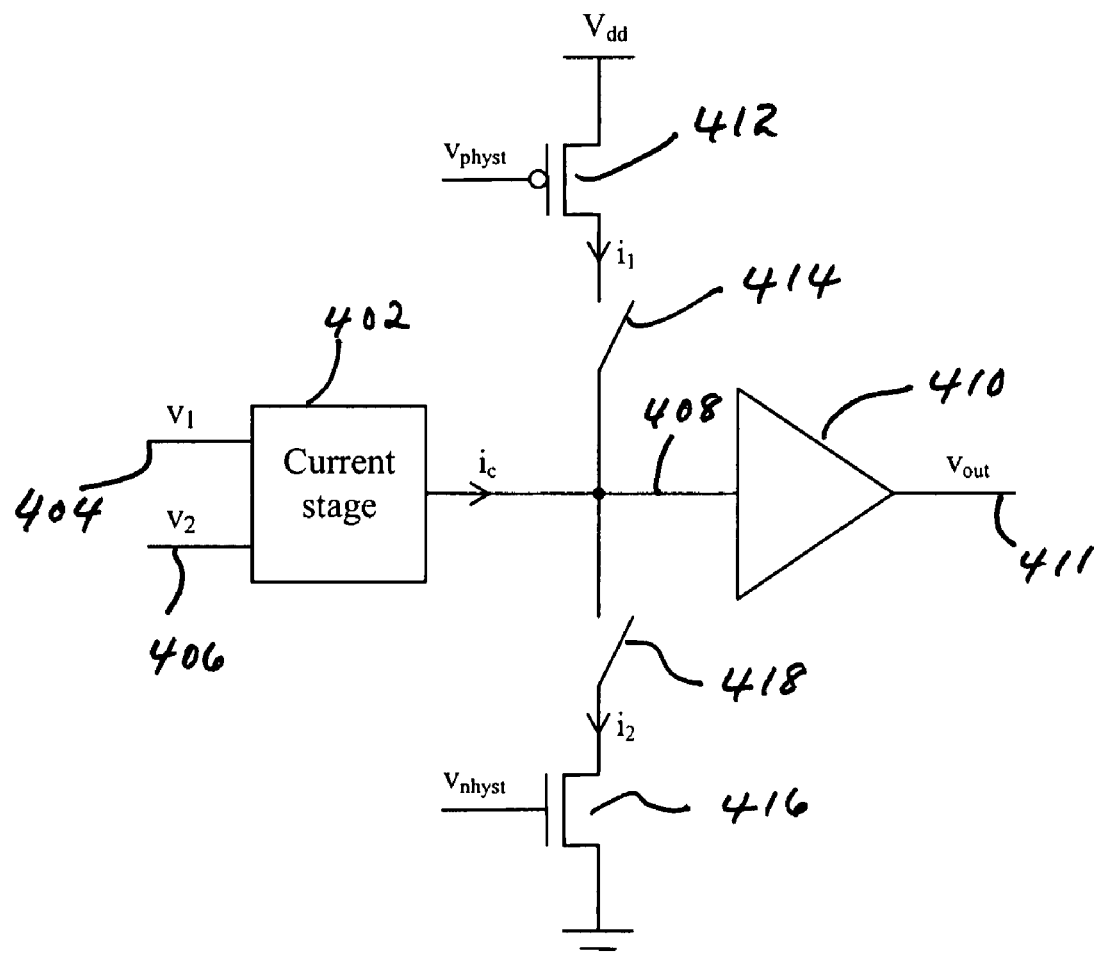
FIG. 4 shows an example of a comparator according to embodiments of the invention.

FIG. 4 shows an embodiment of a comparator 400 according to embodiments of the invention. The comparator 400 comprises a current stage 402 to which comparator input voltages $v_1$ and $v_2$ are provided via inputs 404 and 406. The current stage 402 outputs a current $i_c$ which is proportional to a difference $v_{diff}$ between the input voltages, so $v_{diff}=v_1-v_2$. Thus, the input 404 is the positive input of the comparator 400 and the input 406 is the negative input.

The current $i_c$ output from the current stage 402 is provided to an input 408 of an amplifier 410 which amplifies a current provided to the input 408 and provides an output voltage $v_{out}$ on a comparator output 411. A p-channel transistor 412 and a first switch 414 are connected in series between a positive power supply voltage $V_{dd}$ and the input 408 to the comparator 410. A first control voltage $v_{physt}$ is supplied to the gate of the transistor 412. An n-channel transistor 416 and a second switch 418 are connected in series between a the input 408 to the comparator 410 and ground (in alternative embodiments, this may instead be a negative power supply voltage $V_{ss}$). A second control voltage $v_{nhyst}$ is supplied to the gate of the transistor 416.

The amplifier 410 has a large gain such that the output voltage $v_{out}$ saturates at a respective level even for small currents provided to the input 408. In embodiments of the invention, a positive current provided to the input 408 causes the output $v_{out}$ to saturate at a first voltage representing logic 1, and a negative current provided to the input 408 (i.e. a positive current sunk from the input 408) causes the output $v_{out}$ to saturate at a second voltage representing logic 0.

Figure 5:
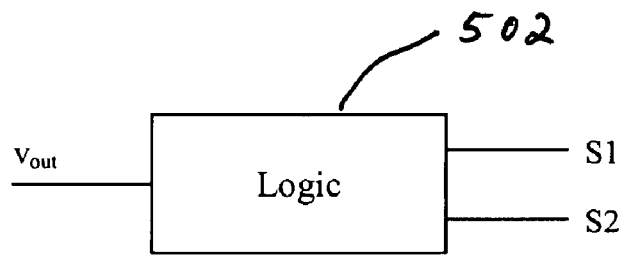
FIG. 5 shows an example of logic for controlling switches in embodiments of the invention.

FIG. 5 shows an example of logic 500 for controlling the switches 414 and 418. The output $v_{out}$ from the amplifier 410 is provided to a logic block 502. The logic block processes the input $v_{out}$ and provides output signals S1 and S2 that control the switches 414 and 418 respectively. The output signals S1 and S2 are arranged such that when $v_{out}$ is logic 0, meaning that $v_1<v_2$, the switch 414 is open and the switch 418 is closed, and when $v_{out}$ is logic 1, meaning that $v_1>v_2$, the switch 414 is closed and the switch 418 is open. Thus, when the output $v_{out}$ of the comparator 410 is logic 0, a current $i_2$ is sunk from (i.e. subtracted from) the input 408 of the amplifier 410, and when $v_{out}$ is logic 1, a current $i_1$ is sourced to (i.e. added to) the input 408. As a result, hysteresis is introduced into the comparator 400 such as, for example, that shown in FIG. 2. The currents $i_1$ and $i_2$ are determined by the first and second control voltages $V_{physt}$ and $v_{nhyst}$ provided to the gates of the transistors 412 and 416 respectively.

In embodiments of the invention, the switches 414 and 418 are closed when provided with a logic 1 signal and open when provided with a logic 0 signal. Therefore, for example, the logic block is arranged such that the signal S1 is of the same logic level as $v_{out}$ and the signal S2 is the logic inverse of $v_{out}$.

Figure 6:
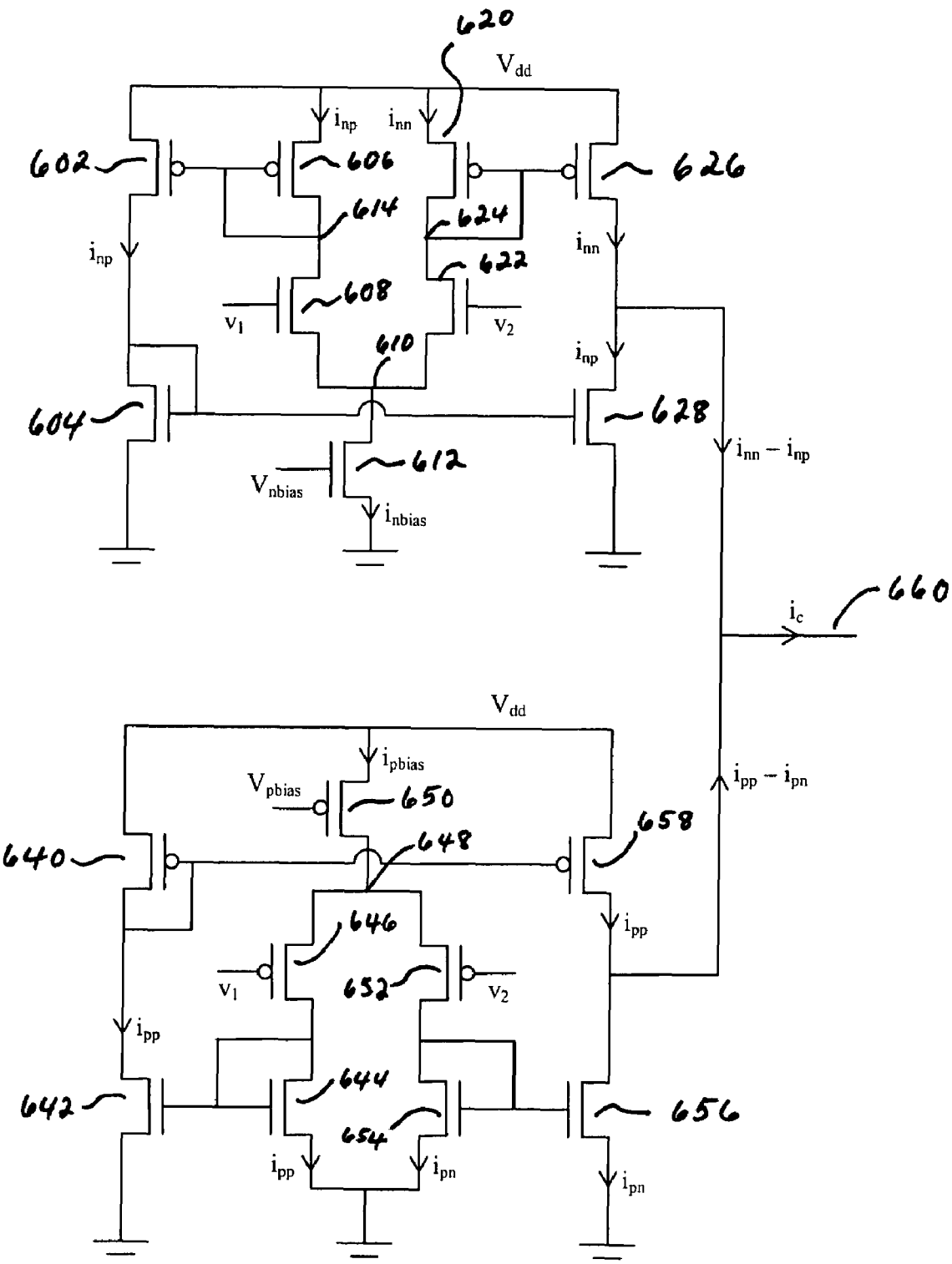
FIG. 6 shows an example of a current stage.

FIG. 6 shows an example of a current stage 600 that provides an output current $i_c$ proportional to $v_{diff}$, the difference between the voltage inputs $v_1$ and $v_2$. The current stage 600 includes a p-channel transistor 602 connected between a positive power supply voltage $V_{dd}$ and the drain of an n-channel transistor 604. The source of the transistor 604 is connected to ground. The gate of the transistor 602 is connected to the gate of a p-channel transistor 606. The transistor 606 and an n-channel transistor 608 are connected in series between $V_{dd}$ and a node 610. The voltage $v_1$ provided to the positive input of the comparator is provided to the gate of the transistor 608. A n-channel transistor 612 is connected between the node 610 and ground. A first bias voltage $V_{nbias}$ is provided to the gate of the transistor 612, thus causing a bias current $i_{nbias}$ to flow through the transistor 612. The gates of the transistors 602 and 606 are connected to a node 614 between the transistors 606 and 608.

A p-channel transistor 620 and a n-channel transistor 622 are connected in series between $V_{dd}$ and the node 610. The voltage $v_2$ provided to the negative input of the comparator is provided to the gate of the transistor 622. The gate of the transistor 620 is connected to a node 624 between the transistors 620 and 622, and is also connected to the gate of a p-channel transistor 626. The transistor 626 and a n-channel transistor 628 are connected between $V_{dd}$ and ground. The gate of the transistor 628 is connected to the gate and drain of the transistor 604.

A p-channel transistor 640 and n-channel transistor 642 are connected in series between $V_{dd}$ and ground. The gate of the transistor 642 is connected to the gate and drain of a n-channel transistor 644. A p-channel transistor 646 and the transistor 644 are connected in series between a node 648 and ground. The voltage $v_1$ is provided to the gate of the transistor 646. A p-channel transistor 650 is connected between $V_{dd}$ and the node 648. A second bias voltage $V_{pbias}$ is provided to the gate of the transistor 650, thus causing a bias current $i_{pbias}$ to flow though the transistor 650.

A p-channel transistor 652 and a n-channel transistor 654 are connected between the node 648 and ground. The voltage $v_2$ is provided to the gate of the transistor 652. The gate of the transistor 654 is connected to the drain of the transistor 654 and also the gate of a n-channel transistor 656. A p-channel transistor 658 and the transistor 656 are connected in series between $V_{dd}$ and ground. The gate of the transistor 658 is connected to the gate and drain of the transistor 640.

An output 660 of the current stage 600 is connected to the drains of the transistors 626 and 628, and also to the drains of the transistors 656 and 658.

When the current stage 600 is in operation, due to the voltages $v_1$ and $v_2$, currents $i_{np}$ and $i_{nn}$ flow through the transistors 608 and 622 respectively, where the sum of the currents $i_{np}$ and $i_{nn}$ is substantially equal to $i_{nbias}$. A current mirror is set up between the transistors 606 and 602 such that the current $i_{np}$ also flows through the transistors 602 and 604.

A current mirror is also set up between the transistors 604 and 628 such that the current $i_{np}$ also flows through the transistor 628.

A current mirror is set up between the transistors 620 and 626 such that the current $i_{nn}$ also flows through the transistor 626. The difference $i_{nn}-i_{np}$ between the currents flowing through the transistors 626 and 628 flows to the output 660.

Due to the voltages $v_1$ and $v_2$, currents $i_{pp}$ and $i_{pn}$ flow through the transistors 646 and 652 respectively. The sum of the currents $i_{pp}$ and $i_{pn}$ is substantially equal to $i_{pbias}$. A current mirror is set up between the transistors 644 and 642 such that the current $i_{pp}$ flows through the transistors 640 and 642. A current mirror is also set up between the transistors 640 and 658 such that the current $i_{pp}$ also flows through transistor 658.

A current mirror is set up between the transistors 654 and 656, such that the current $i_{pn}$ flows through the transistor 656. The difference $i_{pp}-i_{pn}$ between the currents flowing through the transistors 656 and 658 flows to the output 660.

An output current $i_c$ is provided at the output 660, and comprises $(i_{nn}-i_{np})+(i_{pn}-i_{pp})$. Thus, the current stage 600 produces a current that is substantially proportional to the difference $v_{\textit{diff}}$ between the input voltages $v_1$ and $v_2$.

Figure 7:
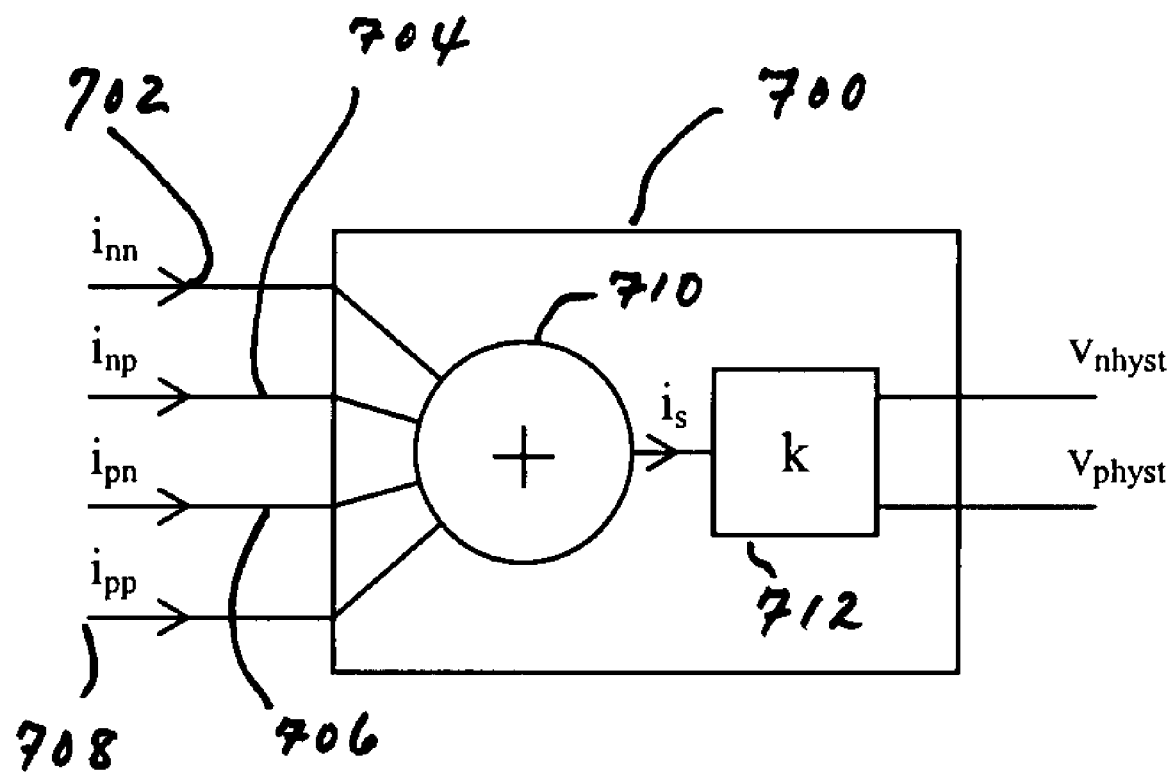
FIG. 7 shows an example of apparatus for producing control voltages.

FIG. 7 shows an example of apparatus 700 for producing the control voltages $v_{physt}$ and $v_{nhyst}$ for controlling the transistors 412 and 416 respectively shown in FIG. 4. The transistors 412 and 416 are controlled such that the hysteresis voltages b and c shown in FIG. 2 remain substantially the same with changes in bias currents in the current stage. For example, the control voltages are produced such that the currents $i_1$ and $i_2$ in FIG. 4 are proportional to the sum of the bias currents $i_{nbias}$ and $i_{pbias}$ of the current stage 600 shown in FIG. 6.

The apparatus 700 includes four inputs 702, 704, 706 and 708 for the currents $i_{nn}$, $i_{np}$, $i_{pn}$ and $i_{pp}$ respectively. These currents may be provided, for example, as mirrors of the respective currents in the current stage 600. For example, the current $i_{nn}$ may be provided to the input 702 by a p-channel transistor (not shown) that has its gate connected to the gate and drain of the transistor 620 shown in FIG. 6 in a current mirror arrangement. The apparatus 700 includes a current summer 710 that sums the currents supplied to the inputs 702 to 708 and provides the sum current $i_s$ to a scaling unit 712. The scaling unit 712 produces voltages $v_{nhyst}$ and $v_{physt}$ that are proportional to the sum current $i_s$. As the bias current $i_{nbias}$ is substantially equal to the sum of the currents $i_{np}$ and $i_{nn}$, and the bias current $i_{pbias}$ is substantially equal to the sum of the currents $i_{pp}$ and $i_{pn}$ then the voltages $v_{nhyst}$ and $v_{physt}$ are substantially proportional to the sum of the bias currents $i_{nbias}$ and $i_{pbias}$.

Thus, the hysteresis of the comparator remains substantially constant (that is, the voltages b and c remain substantially constant) even with changes in the bias current of the current stage, by keeping the control voltages $v_{nhyst}$ and $v_{physt}$ (and hence the bias currents $i_1$ and $i_2$) substantially proportional to the bias current of the current stage. The hysteresis of the comparator remains substantially constant even if the common mode input level is such that either of the current sources 612 or 650 is forced out of the active region and $i_{nbias}$ or $i_{pbias}$ is affected.

Figure 1:
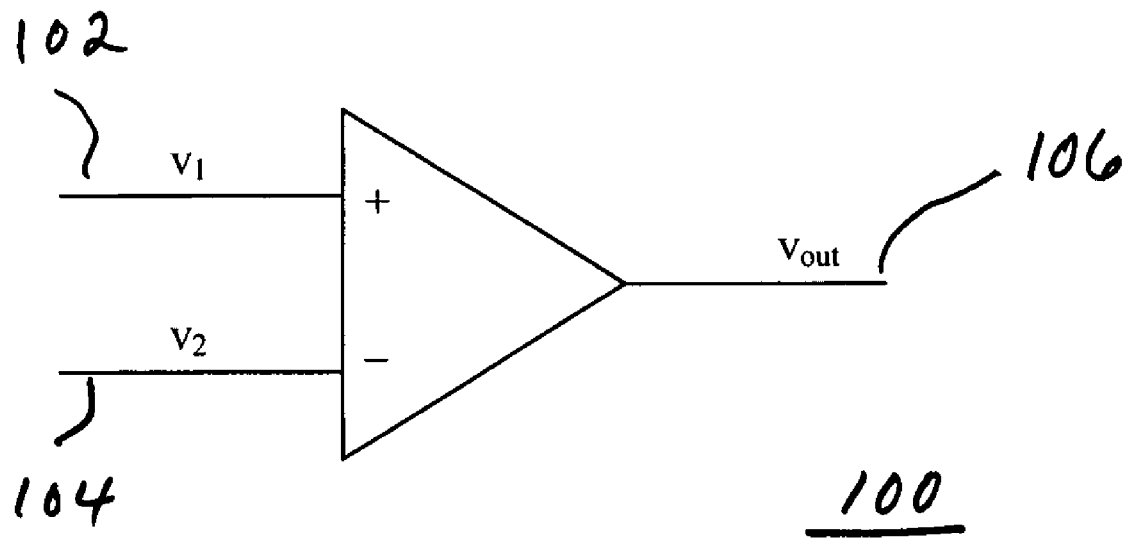
FIG. 1 shows an example of a known comparator.
Figure 2:
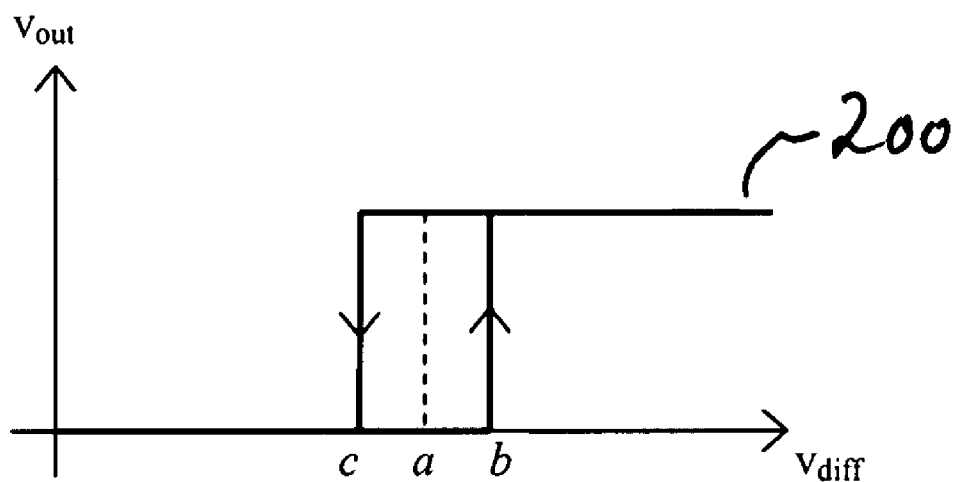
FIG. 2 shows an example of hysteresis in a comparator.
Figure 3:
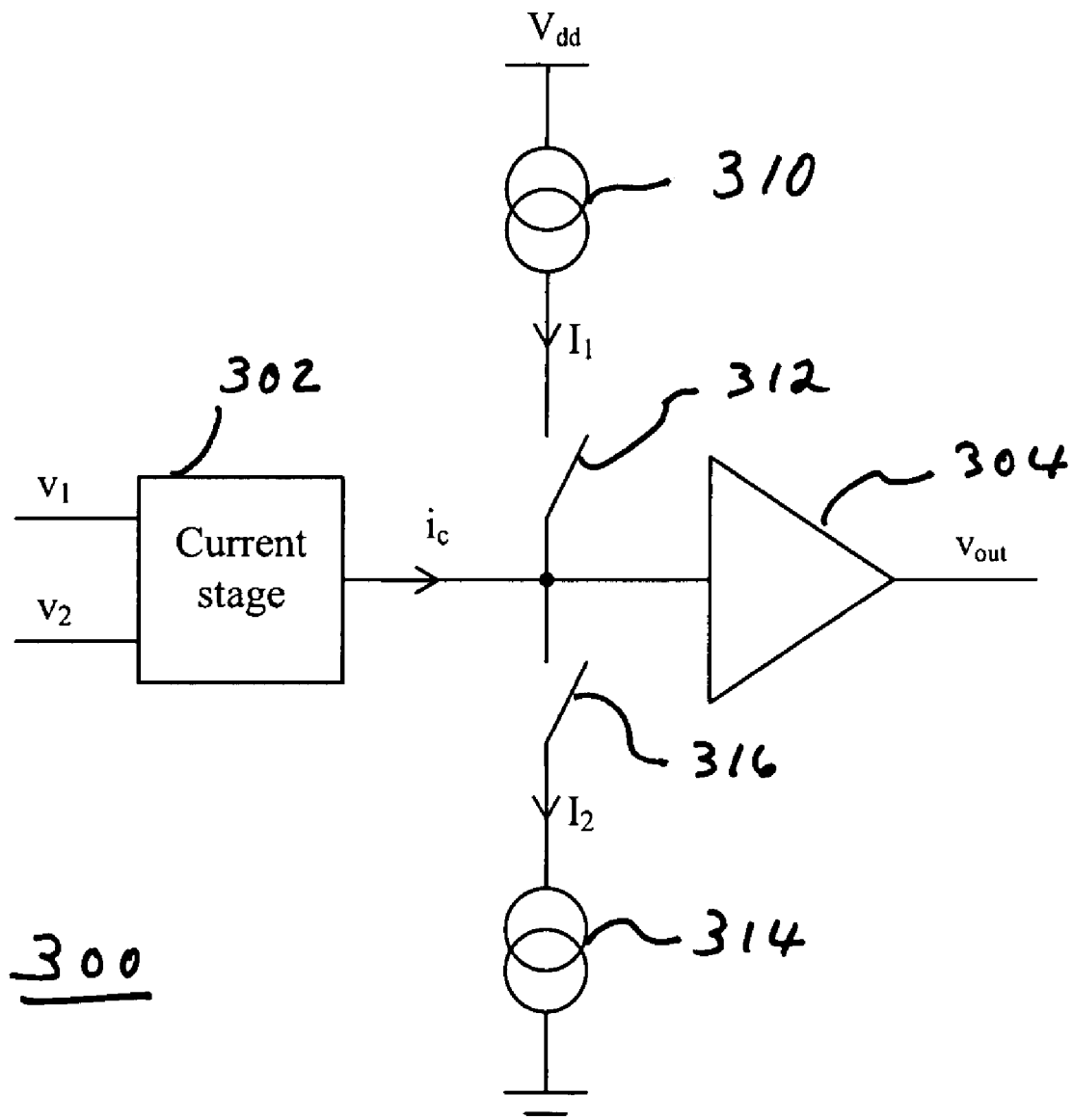
FIG. 3 shows an example of a known comparator with hysteresis in more detail.

In embodiments of the invention, the scaling unit is programmable such that the hysteresis of the comparator is programmable (i.e. the voltages a and b in FIG. 2 are programmable). This can be achieved in one or more of a number of ways. For example, one or more transistors that produce current as part of a current mirror arrangement may be switched into or out of a circuit using switches.

Embodiments of the invention may be used in may types of electronic devices where two signals (such as two voltages) are compared.

It will be appreciated that embodiments of the present invention can be realised in the form of hardware, software or a combination of hardware and software. Any such software may be stored in the form of volatile or non-volatile storage such as, for example, a storage device like a ROM, whether erasable or rewritable or not, or in the form of memory such as, for example, RAM, memory chips, device or integrated circuits or on an optically or magnetically readable medium such as, for example, a CD, DVD, magnetic disk or magnetic tape. It will be appreciated that the storage devices and storage media are embodiments of machine-readable storage that are suitable for storing a program or programs that, when executed, implement embodiments of the present invention. Accordingly, embodiments provide a program comprising code for implementing a system or method as claimed in any preceding claim and a machine readable storage storing such a program. Still further, embodiments of the present invention may be conveyed electronically via any medium such as a communication signal carried over a wired or wireless connection and embodiments suitably encompass the same.

All of the features disclosed in this specification (including any accompanying claims, abstract and drawings), and/or all of the steps of any method or process so disclosed, may be combined in any combination, except combinations where at least some of such features and/or steps are mutually exclusive.

Each feature disclosed in this specification (including any accompanying claims, abstract and drawings), may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed. The claims should not be construed to cover merely the foregoing embodiments, but also any embodiments which fall within the scope of the claims.

I claim:

1. A comparator, comprising:
   at least one current stage for providing a first current proportional to a difference between first and second comparator inputs, the first current being provided to an amplifier input;
   an amplifier for amplifying a current provided to the amplifier input and providing a comparator output;
   an apparatus for introducing hysteresis, comprising at least one of a current source and a current sink, the current source being arranged to selectively source a source current to the amplifier input such that the comparator output changes from a first state to a second state when a difference between the first and second inputs rises above a first value, and the current sink being arranged to selectively sink a sink current from the amplifier input such that the comparator output changes from the second state to the first state when the difference between the first and second inputs falls below a second value; and apparatus for controlling at least one of the source current and the sink current to be proportional to a bias current of the current stage.

2. A comparator as claimed in claim 1, wherein the current source comprises at least one first input transistor for producing a first input current in response to the first input, and at least one second transistor for producing a second input current in response to the second input, the bias current of the current stage substantially comprising a sum of the first and second input currents.

3. A comparator as claimed in claim 2, comprising control apparatus for receiving at least one of the first and second input currents and producing control signals proportional to the at least one of the first and second input currents, the control signals being used to control the at least one of the current source and the current sink.

4. A comparator as claimed in claim 1, wherein the apparatus for controlling comprises an apparatus for generating at least one control signal for the at least one of the source current and the sink current such that the at least one control signal is proportional to the bias current of the current stage.

5. A method of comparing two signals, comprising:
producing a first current proportional to a difference between the two signals;
providing the first current to an amplifier input;
amplifying the current provided to the amplifier input to produce a comparator output;
sourcing a source current to the amplifier input when the comparator output is a first logic level;
sinking a sink current from the amplifier input when the comparator output is a second logic level; and
controlling at least one of the source current and the sink current to be proportional to a bias current of apparatus used to produce the first current.

6. An electronic device including a comparator as claimed in claim 1.

* * * * *